United States Patent
Salatino et al.

(10) Patent No.: US 6,291,317 B1
(45) Date of Patent: Sep. 18, 2001

(54) METHOD FOR DICING OF MICRO DEVICES

(75) Inventors: Nicholas J. Salatino, Penfield; John C. Ackerman, Rochester, both of NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/730,819

(22) Filed: Dec. 6, 2000

(51) Int. Cl.[7] .................. H01L 21/46; H01L 21/78; H01L 21/301

(52) U.S. Cl. .................. 438/462; 438/21; 438/113; 438/460; 438/458; 83/39; 83/49; 83/51; 83/52; 83/906; 83/929.1; 83/945

(58) Field of Search .................. 438/113, 21, 460, 438/462, 458; 83/39, 49, 51, 52, 906, 929.1, 945

(56) References Cited

U.S. PATENT DOCUMENTS

| | | | |
|---|---|---|---|
| 4,851,371 | 7/1989 | Fisher et al. | 437/226 |
| 5,057,853 | 10/1991 | Fisher | 346/140 R |
| 5,160,403 | 11/1992 | Fisher et al. | 156/633 |
| 5,266,528 | 11/1993 | Yamada | 437/226 |
| 5,302,554 | * 4/1994 | Kashiwa et al. | 437/227 |
| 5,306,370 | 4/1994 | Herko et al. | 156/155 |
| 5,408,739 | 4/1995 | Altavela et al. | 29/611 |
| 5,506,610 | 4/1996 | Altavela et al. | 347/47 |
| 5,620,614 | 4/1997 | Drake et al. | 216/27 |
| 5,637,388 | 6/1997 | White et al. | 428/109 |

* cited by examiner

Primary Examiner—John F. Niebling
Assistant Examiner—David A. Zarneke
(74) Attorney, Agent, or Firm—Christopher D. Wait

(57) ABSTRACT

A method for dicing small devices including MEMS, ink jet printheads, lasers etc. The method comprises making a first pass cut into a substrate with a blade of narrow kerf and having long wear characteristics. This first pass cut is then followed with a polishing blade of wider kerf having desirable smooth cutting qualities.

29 Claims, 2 Drawing Sheets

METHOD FOR DICING OF MICRO DEVICES

BACKGROUND OF THE INVENTION AND MATERIAL DISCLOSURE STATEMENT

The present invention relates to a methodology for precision cutting of discrete devices such as found, for example, in the MEMS (Micro-Electro-Mechanical Systems) arts. In particular the present invention is directed to the utilization of resin bond and nickel bond dicing blades in a methodology for the dicing of very small discrete devices such as ink jet printheads.

There are many prior art discrete devices which are formed as a plurality of substrates integrally formed in a wafer or the like and which require intermediate cuts and/or separation into individual sub-units as a step in the fabrication process. Examples of such discrete devices and MEMS are ink jet printheads, lasers, magnetic heads, and semiconductor sensor devices. Most, but not all, of the devices are formed in silicon-based wafers. A preferred technique for separating the sub-units is to saw through the wafer in a procedure referred to as "dicing". The device used to perform the cutting is referred to as a dicing blade or dicing saw. For cutting operations requiring high precision (±10 microns) resin bonded or resinold/diamond blades have been preferred, especially in the production of thermal ink jet printheads, because they form precisely placed, smooth chip-less cuts. These resin bond blades have been typically constructed of a resin-diamond blend. For example, a resinold/diamond blade is disclosed in U.S. Pat. No. 4,878,992 incorporated in its entirety for its teaching, which is constructed of a relatively hard, dense resin bonded material and a 60 to 90% concentration of natural or synthetic diamonds. Other resinold/diamond blades and their use are disclosed in U.S. Pat. Nos. 5,160,403, 5,266,528 and 4,851,371 also incorporated in their entirety for their teaching.

These resin bonded or resinold/diamond blades still suffer from performance variability manifested in the asymmetric wear of the blade periphery and shortened blade life due to chipping caused by the forces generated when pieces of silicon or diamond particles loosened from the dicing blade become jammed between the rotating dicing blade and the silicon wafers being cut. The use of natural or synthetic diamonds also adds to the expense and thereby the desirability of limiting wear and extending blade life.

For a thermal ink jet device it is extremely difficult to produce a high quality cut surface on the device, while maintaining a high cut placement accuracy. The accuracy of cut placement is limited by the necessary use of a soft (phenolic resin) bond dicing blade. A resin bond dicing blade provides the necessary cutting quality, without causing chipping and cracking damage to a relatively brittle silicon device. However, the resin bond blade has a number of limitations when used to dice an ink jet device. These limitations include: (1) rapid and (2) uneven blade wear, (3) decreased cut placement accuracy (+/−6 $\mu$m @ 1$\sigma$) due to both blade bending and abnormal blade wear, and (5) limited feed rate throughput (1–3 mm/sec. Feed rate).

Use of nickel bonded dicing blades overcomes the limitations of resin bonded blades. But, nickel bonded blades have problems of their own. In particular they cannot provide the required cut quality that must be achieved for the proper functioning of an ink jet printhead. Nickel bond dicing blades are used throughout the semiconductor industry in applications where silicon devices need to be diced on wafers. In most applications, the cut quality requirements are driven by a need to minimize cut edge chipping only along the top and bottom surface of the wafers. Many dicing applications like IC chip fabrication can withstand levels of chipping that are unacceptable when applied to dicing thermal ink jet, micro-lasers, or MEMS devices. This is due to the fact that the function of the dicing cut in standard applications is only to separate the devices and any expected chipping can be accounted for in the design of the wafer dicing street width (chip kerf area) and by blade selection. Because of the greater strength of nickel bonded blades they can be used at much greater feed rates for increased throughput. Feed rates for standard wafer dicing operations may approach and even exceed 100 mm/sec., depending on the material being diced. Nickel bond blades also provide excellent cut placement accuracy due to the high strength and low wear rate which provide resistance to bending and uneven blade wear.

With thermal ink jet devices there are two requirements which must be met. The first purpose is of course to separate the devices. However the second and more critical purpose of the cut is to expose and define the ink outlet surface of the die. To achieve this a high quality surface finish is necessary to ensure that uniform ink drop formation generation and directionality when used in the printer. It is critical that chipping is minimized on this surface to prevent misdirection of the ink drop, which thereby degrades print quality. Tests utilizing nickel bond blades has shown that that the surface finish therein provided is not acceptable.

Therefore, as discussed above there exists a need for a technique and methodology which will solve the problem of providing an acceptable surface finish while also providing greater throughput, less rapid and uneven wear, greater cut placement accuracy, and avoid undesirable cut angles. Thus, it would be desirable to solve this and other deficiencies and disadvantages with an improved methodology.

SUMMARY OF THE INVENTION

The present invention relates to a method for micromachining ink jet printheads on a substrate, comprising sawing the substrate with a first saw blade to yield a first pass kerf on the substrate. Where the first pass kerf has a first kerf width. This is followed with polishing the first pass kerf with a second saw blade to yield a second pass kerf from the first pass kerf. The second pass kerf has a second kerf width, which is wider than the first kerf width.

More particularly, the present invention relates to a method for dicing ink jet printheads from a substrate having a front side and a back side. First by sawing the substrate with a first saw blade to yield a first pass kerf on the front side of the substrate. The first pass kerf has a first kerf width. Then polishing the first pass kerf with a second saw blade to yield a second pass kerf from the first pass kerf, where the second pass kerf width is wider than the first pass kerf width. The final step being sawing the substrate from the back side of the substrate in alignment with the second pass kerf and intersecting the second pass kerf.

DESCRIPTION OF THE INVENTION

Figure 1:
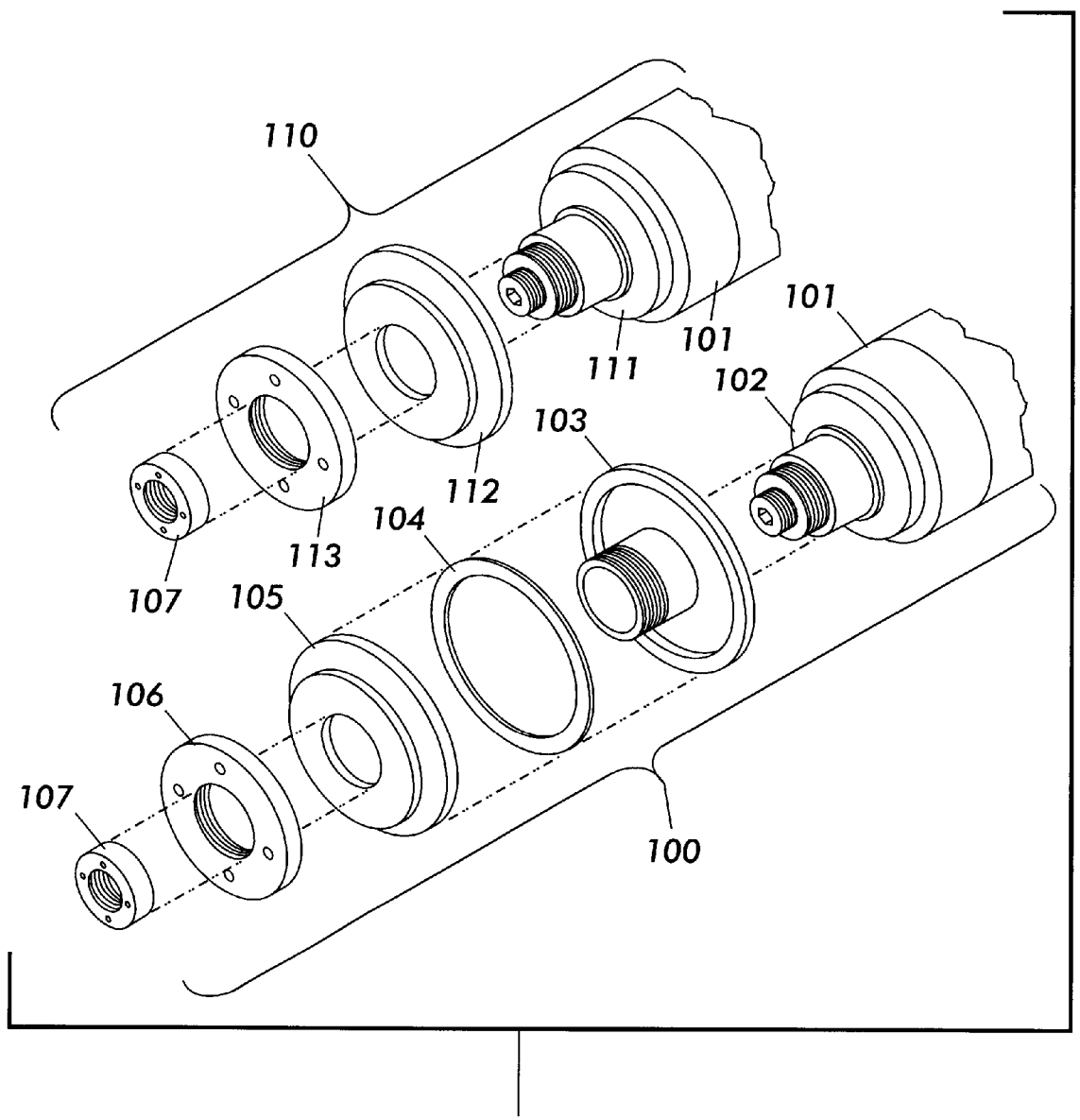
FIG. 1 depicts an isometric depiction of two types of saw blade arrangements with their respective mounting on a dicing machine.

FIG. 1 provides an isometric depiction of two types of saw blade arrangements with their respective mounting on a dicing machine. A typical flange-less blade arrangement 100 is commonly employed with nickel bonded blades. Spindle 101 has stacked upon it wheel mount 102 followed by flange 103. Saw blade 104 is located between flange 103 and flange 105. Flange 105, is in turn, bounded by flange nut 106 and lock nut 107. A resin bonded blade however, is typically employed as a hub type saw arrangement 110. Spindle 101 has placed upon it hub wheel mount 111 which receives thereon hub type blade 112. The hub type blade 112 is held in place with hub flange nut 113 and lock nut 107.

Figure 2:
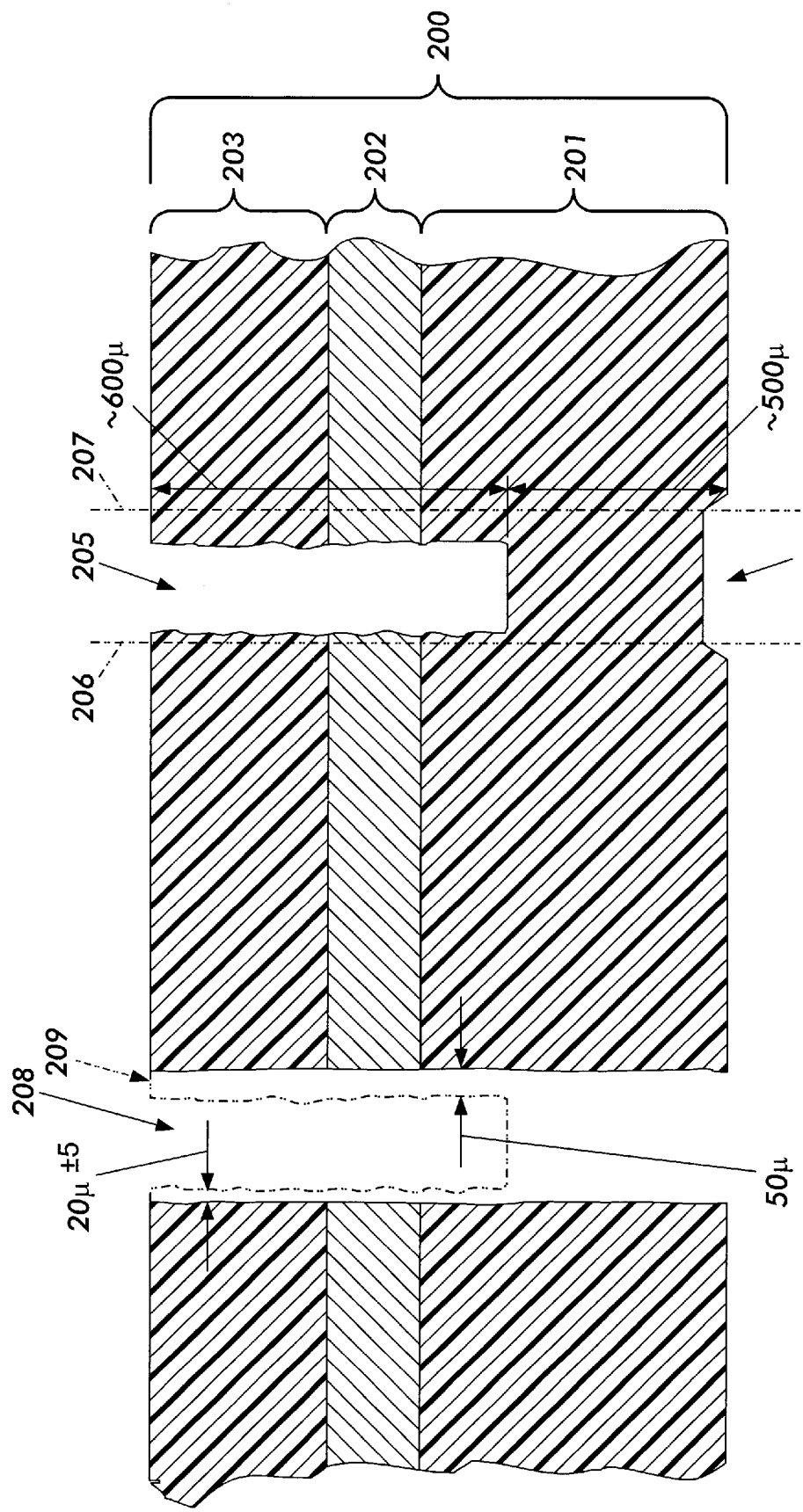
FIG. 2 depicts a cross-sectional view of a substrate being diced according to the present invention.

FIG. 2 depicts a schematical representation of a typical substrate 200 of undiced ink jet printer heads as viewed in cross-section and ready for dicing. The substrate is actually composed of a sandwich of bonded silicon wafers having a polyimide layer between. The lower silicon wafer is referred to as a heater wafer 201. Arranged upon the heater wafer 201 is the polyimide layer 202 which is approximately 30 microns thick. On top of the polyimide 202 is placed the channel wafer 203. It is in this channel wafer 203 that the ink jets have been etched into with prior processing steps. These layers are aligned and bonded under heat and pressure to form substrate 200 having a typical composite thickness of approximately 1.15 millimeters. Prior to the dicing operation, a relief 204 is cut into the backside of the substrate 200. The substrate is placed upon tacky tape and put in a frame which is secured to the dicing saw by a vacuum chuck.

In a preferred embodiment of the invention, two saw passes are made in the dicing operation. A first pass cut 205 is performed in a preferred embodiment with a nickel bonded blade type. This first pass cut 205 is narrow in kerf, typically 150 microns in a preferred arrangement, and has a depth of cut at least sufficient to cut through and past the polyimide layer 202. In our current example this is a cut depth of approximately 600 microns. However, what is important to a preferred embodiment operation of the invention is that the polyimide layer 202 is cut completely through with the first pass cut 205.

The first pass kerf 205 is not centered in the street between printheads. The street is that area allowed for by design for dicing to take place. The street is indicated here by alignment lines 206 and 207. Alignment lines 206 and 207 are provided in the figure as visual aides in delineating the street and the bounds of the ink jet heads. Alignment line 206 represents where the polished ink jet printhead face is desired and is where the jet outlets are to be formed by the dicing operation. The amount of material on the side wall of the first pass kerf 205 to the face alignment line 206 is in a preferred embodiment about 20 microns. This leaves about 50 microns of material on the other side wall to alignment line 207. However, the amount left here is not critical. This first pass cut 205 may have relatively poor surface finish so long as it has cut through the more abrasive and difficult to cut polyimide layer 202.

The second pass polishing cut 208 is aligned with the first pass cut but uses a wider kerf blade on the dicing saw. Dotted line 209 is provided as a visual aid in depicting the preferred arrangement for the alignment of the first pass cut 205 relative to the second pass cut 208. In a preferred embodiment the blade used for the second pass cut 208 is a resin bonded type. In a more preferred embodiment the blade is a phenolic resin diamond type such as described in U.S. Pat. No. 5,637,388 to White, et al., which is incorporated by reference herein in its entirety for its teaching. In a preferred embodiment the kerf width is 220 microns in width. It is also arranged such that the blade cutting depth completes the cut through the relatively softer silicon of heater wafer 201 to separate the ink jet heads. However, the invention may be practiced without providing the final separation of ink jet devices as will be evident to those skilled in the art. Examples of various dicing approaches may be found in U.S. Pat. Nos. 5,057,853, 5,306,370, 5,506,610, and 5,408,739, which are herein incorporated by reference for their teaching.

The primary aim of the second pass cut 208 is to polish the first pass cut 205. In a preferred embodiment it is to polish the face of the ink jet print head back to alignment line 206. As noted above, the second pass cut 208 while wider of kerf is not necessarily centered on the previous first pass cut 205. In a preferred embodiment arrangement, the alignment of second pass cut 208 overlaps the first pass cut 205 (as depicted by dotted line 209) on one side by 20 microns and by 50 microns on the other. This arrangement is based upon empirical data which shows that 20 microns to the ink jet face achieves the best result in cutting the ink jet outlets. This arrangement provides the requisite amount of accuracy, avoiding any chipping of the ink jet outlet channel at the ink jet face, while providing an exemplary degree of surface finish.

In effect first pass cut 205 acts as an alignment guide for the second pass polishing cut 208. By virtue of first pass cut 205 keeping the resin bonded blade of cut 208 in alignment there is considerably less flexure of the blade. This significantly helps to reduce uneven blade wear for the resin bonded blade. This reduction of blade flexure also contributes to improved accuracy of cut, as there is less blade wander in the street. This reduction of uneven blade wear in combination with prior cutting of the relatively more abrasive polyimide by the first pass cut, yields the improved wear data as shown in the following table:

| | Blade Wear ($\mu$m/wafer) | |
|---|---|---|
| Trial # | Resin | Resin & Nickel |
| 1 | 18 | 5 |
| 2 | 12 | 2 |
| 3 | 10 | 6 |
| 4 | 18 | 1 |
| 5 | 16 | 1 |
| Average | 15 | 3 |

As can be seen from examination of the above table there is an approximate five to one reduction in resin bonded blade wear utilizing the present invention. Furthermore, all of the above attributes contribute to allowing a more than double increase in the bonded blade saw feed rate, from about 3 mm/sec feed rate to one of approximately 7 mm/sec.

In a preferred embodiment, a double spindle feed saw is utilized. One example of which is as sold by the manufacturing company Disco™. In a preferred approach the resin bonded blade is mounted in-line behind the nickel blade. However, as will be apparent to one skilled in the art other approaches may be used as for example by offsetting the blades by the street-to-street distance so that a first pass cuts just the narrow kerf, with each subsequent pass cutting both a new narrow kerf while polishing wider the prior pass narrow kerf. That is until the last pass on the wafer of course, where only the last polishing for the wider kerf is cut.

In a further embodiment, a surfactant may be used in the second pass polishing cut. This has some benefit in improving the surface polish finish achieved on the face of the ink jet printhead. For fabrication of other types of micro devices this can be of particular importance (lasers for example).

One such surfactant which has been successful is Diamaflow™. But those skilled in the art will be readily able to determine other surfactant choices.

In summary, practicing the methodology of the present invention reduces rapid blade wear and abates uneven blade wear for resin bonded type blades. Due to the reduced blade wear coupled with reduced blade bending, the cut placement accuracy is improved. Finally, the present invention allows a greater feed rate throughput. This means that a dicing tool will be down less for blade changes while also achieving greater product throughput in the manufacturing environment.

While the embodiment disclosed herein is preferred, it will be appreciated from this teaching that various alternative, modifications, variations or improvements therein may be made by those skilled in the art, which are intended to be encompassed by the following claims.

What is claimed is:

1. A method for micro-machining ink jet printheads on a substrate, comprising:

sawing the substrate with a first saw blade to yield a first pass kerf on the substrate, the first pass kerf having a first kerf width; and, polishing the first pass kerf with a second saw blade to yield a second pass kerf from the first pass kerf, the second pass kerf having a second kerf width, where the second kerf width is wider than the first kerf width.

2. The method of claim 1 wherein the first saw blade is nickel bonded.

3. The method of claim 2 wherein the second saw blade is resin bonded.

4. The method of claim 3 wherein the first saw blade is 70 microns narrower than the second saw blade.

5. The method of claim 3 wherein the second saw blade is a phenolic resin diamond type.

6. The method of claim 3 wherein the first saw blade is 150 microns wide and the second saw blade is 220 microns wide.

7. The method of claim 6 wherein the first pass kerf is of sufficient depth to cut through any polyimide layer provided in the substrate.

8. The method of claim 3 with the addition of a prior step comprising:

sawing the substrate from the back side of the substrate.

9. The method of claim 3 wherein the first saw blade and the second saw blade are mounted on a double spindle saw tool.

10. The method of claim 5 wherein the polishing step is provided with a surfactant.

11. A method for dicing ink jet printheads from a substrate having a front side and a back side, comprising:

sawing the substrate with a first saw blade to yield a first pass kerf on the front side of the substrate, the first pass kerf having a first kerf width;

polishing the first pass kerf with a second saw blade to yield a second pass kerf from the first pass kerf, the second pass kerf having a second pass kerf width, where the second pass kerf width is wider than the first pass kerf width; and, sawing the substrate from the back side of the substrate in alignment with the second pass kerf and intersecting the second pass kerf.

12. The method of claim 11 wherein the first saw blade is nickel bonded.

13. The method of claim 12 wherein the second saw blade is resin bonded.

14. The method of claim 13 wherein the first saw blade is 70 microns narrower than the second saw blade.

15. The method of claim 12 wherein the second saw blade is a phenolic resin diamond type.

16. The method of claim 15 wherein the first saw blade is 150 microns wide and the second saw blade is 220 microns wide.

17. The method of claim 16 wherein the first pass kerf is of sufficient depth to cut through any polyimide layer provided in the substrate.

18. The method of claim 13 wherein the first saw blade and the second saw blade are mounted on a double spindle saw tool.

19. The method of claim 15 wherein the polishing step is provided with a surfactant.

20. A method for micro-machining devices on a substrate, comprising:

sawing the substrate with a first saw blade to yield a first pass kerf on the substrate, the first pass kerf having a first kerf width; and, polishing the first pass kerf with a second saw blade to yield a second pass kerf from the first pass kerf, the second pass kerf having a second kerf width, where the second kerf width is wider than the first kerf width.

21. The method of claim 20 wherein the first saw blade is nickel bonded.

22. The method of claim 21 wherein the second saw blade is resin bonded.

23. The method of claim 22 wherein the first saw blade is 70 microns narrower than the second saw blade.

24. The method of claim 23 wherein the second saw blade is a phenolic resin diamond type.

25. The method of claim 15 wherein the first saw blade is 150 microns wide and the second saw blade is 220 microns wide.

26. The method of claim 25 wherein the substrate comprises layers of silicon and polyimide.

27. The method of claim 26 wherein the first pass kerf is of sufficient depth to cut through any polyimide layer provided in the substrate.

28. The method of claim 27 wherein the first saw blade and the second saw blade are mounted on a double spindle saw tool.

29. The method of claim 28 wherein the polishing step is provided with a surfactant.

* * * * *